United States Patent [19]

Kochndörfer et al.

[11] Patent Number: 4,478,684

[45] Date of Patent: Oct. 23, 1984

[54] PAPERMAKING MACHINE STOCK TRIM DEFLECTING DEVICE

[75] Inventors: Michael Kochndörfer, Berg; Rüdiger Kurtz, Immenstaad/B.; Werner Meurer, Tettnang; Werner Seider, Ravensburg; Helmut Störr, Berg, all of Fed. Rep. of Germany

[73] Assignee: Escher Wyss GmbH, Ravensburg, Fed. Rep. of Germany

[21] Appl. No.: 512,755

[22] Filed: Jul. 11, 1983

[30] Foreign Application Priority Data

Jul. 14, 1982 [AT] Austria .................................. 2737/82

[51] Int. Cl.³ .......................... D21F 1/56; D21F 1/06; D21G 9/00
[52] U.S. Cl. .................................. 162/337; 162/336; 162/353
[58] Field of Search ............... 162/336, 337, 338, 343, 162/309, 353

[56] References Cited

U.S. PATENT DOCUMENTS 3,281,313 10/1966 Attwood .............................. 162/337
3,361,620 1/1968 Gedemer ............................. 162/337
3,405,031 10/1968 Sisson .................................. 162/337

Primary Examiner—S. Leon Bashore
Assistant Examiner—K. M. Hastings
Attorney, Agent, or Firm—Werner W. Kleeman

[57] ABSTRACT

The papermaking machine contains at least one water pervious dewatering wire or the like for forming a fiber web, particularly one layer of a multi-ply fiber web, and at least one headbox for infeeding a fiber stock suspension to be applied in the form of a free jet to the dewatering wire. Between the headbox and a section of the dewatering wire extending along the headbox there is arranged at least one deflecting device for separating and withdrawing a partial flow or stream of the fiber stock suspension. The deflecting device can be inserted into a marginal region of the free stock jet. Such an arrangement enables, for example, a continuous or infinitely variable adjustment of the format width of the fiber web to be produced. During use of the deflecting device, the partial flow or stream of the stock is deflected prior to the formation of the fiber web and is kept away from the following operational or working sections of the papermaking machine, in particular from a second fiber web or ply located thereat. If desired, the deflected partial stock flow can be returned to the fiber stock suspension supply or infeed system preceding or upstream of the headbox for re-use of the unmixed fiber stock material.

10 Claims, 4 Drawing Figures

U.S. Patent   Oct. 23, 1984   4,478,684
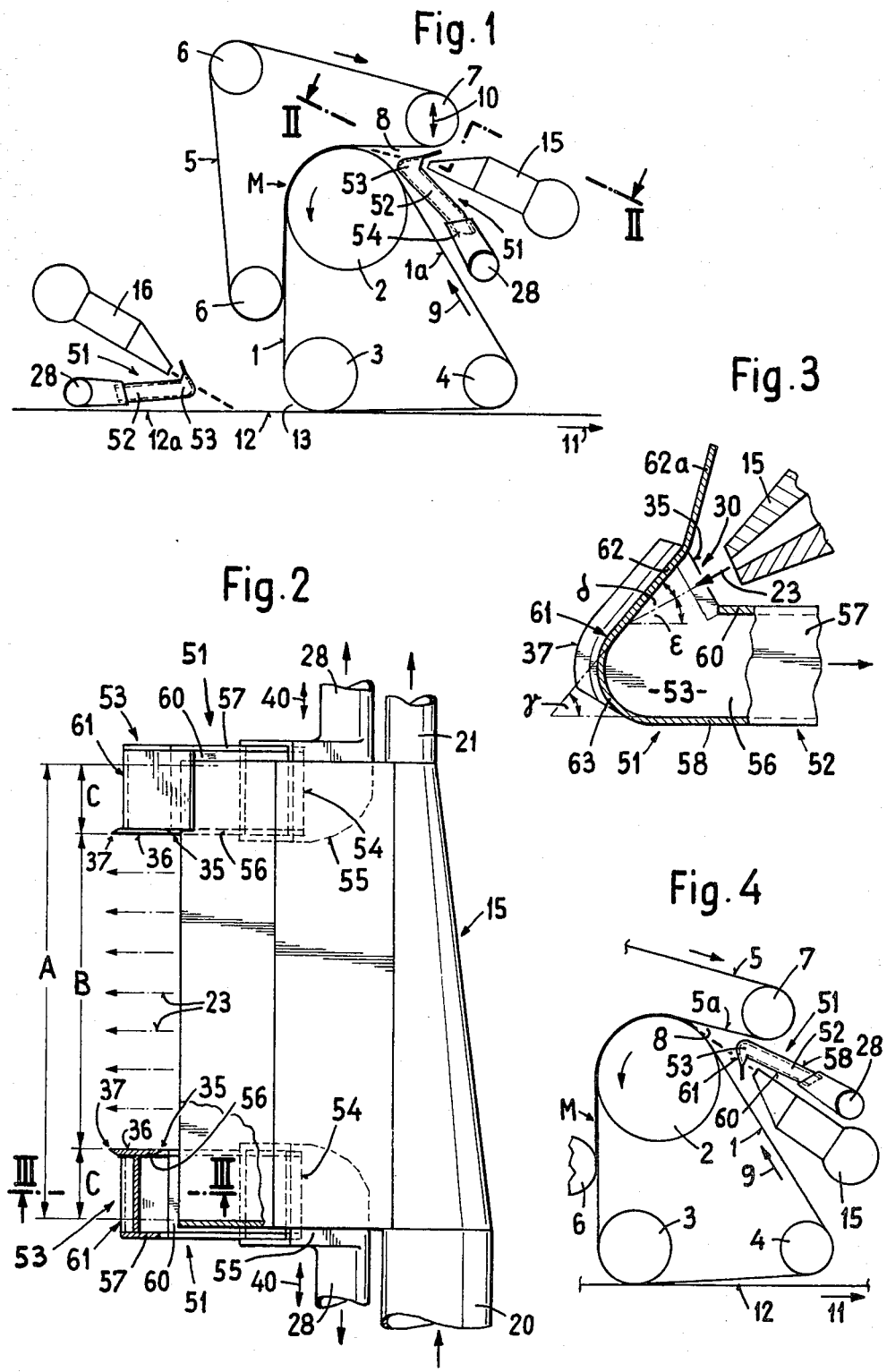

PAPERMAKING MACHINE STOCK TRIM DEFLECTING DEVICE

BACKGROUND OF THE INVENTION

The present invention relates to a new and improved construction of papermaking machine.

In its more specific aspects the present invention relates to a new and improved papermaking machine comprising at least one dewatering means, for instance a wire or sieve or the like, for forming a fiber web or ply and at least one headbox for infeeding a fiber stock suspension which is to be applied to the dewatering wire or the like. The fiber stock suspension is discharged from the headbox through an outfeed slice or gap which extends across a predetermined operating or working width of the headbox. At least one deflecting means or device is provided for separating and taking-up a partial stock flow or stream at a related marginal zone or region of the operating width from a main flow of the fiber stock suspension. Such deflecting means can be introduced into the flow path of the fiber stock suspension between the impact location of the stock fiber suspension at the dewatering wire and the outfeed slice or gap of the headbox.

In a papermaking machine as known, for example, from U.S. Pat. No. 3,361,620, the headbox is directed towards a longitudinal wire and comprises a guide plate extending from the outfeed slice or gap to a location close to the longitudinal wire. The fiber stock suspension flows over this guide plate to the impact or run-on location. In this known papermaking machine the deflecting means or device contains two withdrawal channels which are placed upon the guide plate at the two marginal regions. Each of these withdrawal or discharge channel comprises an inlet opening extending opposite to the outfeed slice or gap, an inlet section which extends substantially in the travel or running direction of the longitudinal wire, and a deflecting section which follows the inlet section on the downstream side thereof and which is laterally extended beyond the margin or edge of the longitudinal wire. The known deflecting means or device requires a relatively large installation space at the region of the papermaking machine which follows downstream of the headbox, in order to positively catch the partial flow or stream of the fiber stock suspension which is to be entrapped and to remove the same from the marginal region. Therefore, the state-of-the-art deflecting means is unsuited for papermaking machine designs having narrow or cramped spatial conditions at the region of the headbox, and particularly cannot be arranged between two converging dewatering wires or the like. The reason therefor is that the cross-section or throat area available for the withdrawal of the excess fiber stock suspension decreases as seen in the direction of flow. Thus, the withdrawal of the arriving amount of fiber stock suspension can be impaired by an apparatus of the known design, for instance in the case of an increased width of the partial flow or stream which is to be separated.

SUMMARY OF THE INVENTION

Therefore, with the foregoing in mind it is a primary object of the present invention to provide a new and improved construction of papermaking machine which is particularly provided with improved deflecting means as concerns the discharge or withdrawal of the separated partial stock flow or stream.

Another important object of the present invention is directed to the provision of a new and improved papermaking machine which is provided with an improved deflecting means or device, particularly as concerns the withdrawal of the separated partial stock flow, and containing a discharge or withdrawal cross-section which can be dimensioned so as to provide an unobstructed throughflow for any amount of fiber stock suspension occurring during operation of the papermaking machine.

Still a further significant object of the present invention is directed to the provision of a new and improved construction of papermaking machine provided with an improved deflecting means containing a stock discharge or withdrawal cross-section which can be dimensioned for the unobstructed throughflow of any amount of fiber stock suspension occurring during operation of the papermaking machine independently of the shape and size of the installation space available at the region of the flow path of the outflowing fiber stock suspension.

Now in order to implement these and still further objects of the invention, which will become more readily apparent as the description proceeds, the papermaking machine of the present development is manifested by the features that, the headbox is spaced from the dewatering wire at a distance which enables the fiber stock suspension to be discharged as a free jet. The deflecting device or means contains a guide channel arranged adjacent the headbox and transversely with respect to the flow direction of the free stock jet, this guide channel being substantially directed or oriented in the direction of travel of the neighboring section of the dewatering wire. The guide channel contains two side walls, at least one guiding or guide wall interconnecting the two side walls and extending substantially along the headbox, an end wall arranged at an end of the guide channel which is located downstream with respect to the travel direction of the dewatering wire and transversely with respect to the flow direction of the free jet, an inlet opening which is delimited or bounded by the end wall in conjunction with the side walls and which inlet opening is directed opposite to the flow direction of the free jet. The end wall contains a wall portion concavely configured with respect to the partial flow or stream and adapted to deflect such partial flow or stream of the fiber stock suspension towards the guiding or guide wall. The guide channel is connected to a withdrawal or discharge member located upstream of the inlet opening with respect to the travel direction of the dewatering wire and leading out of the region of the operating width of the headbox.

By virtue of the deflecting device or means designed in accordance with the teachings of the invention, the partial flow or stream of the fiber stock suspension is separated from the main or primary flow thereof and redirected or deflected at the end wall of the deflecting means, and then is returned throughout its entire width to that region of the papermaking machine which is located close to the inlet side of the headbox along the marginal region of the dewatering wire or the like, whereby the guide channel may comprise a correspondingly advantageous small overall depth or structural height. At this region of the papermaking machine sufficient space is available for the lateral withdrawal or discharge of the excess amount of fiber stock suspension. Correspondingly, any change in format and/or product is simplified and an unnecessary dewatering of the excess amount of fiber stock suspension not used for the formation of the fiber web or ply is avoided, particularly during operation of the machine at a format width of the paper or cardboard to be produced, as the case may be, which is reduced in comparison to the full operating width of the headbox. In corresponding manner raw material losses are kept small. During the production of, for instance, a multi-ply or multi-layer paper or cardboard from different raw materials, the arrangement of a device for removing part of the already formed fiber material ply becomes unnecessary, and which device has a relatively large energy consumption.

To achieve a flow at the inlet region of the guide channel which to a large extent is free of reflections and to prevent the flow from detaching at the deflection region, the end wall of the guide channel conveniently comprises a wall section or portion serving as an impact or run-on location for the free stock jet. Such wall section or portion forms an angle with the outer guide or guiding wall which is greater by about 10° to 30° than the angle which is adjustable for operation of the papermaking machine and which is formed between the guide wall and the flow direction of the free jet.

According to a further development of the papermaking machine according to the invention, the end wall of the guide channel can comprise a wall portion or section which protrudes in the manner of a roof over the inlet opening. Positive take-up of the partial stock flow or stream to be separated is thereby ensured.

According to one embodiment of the papermaking machine according to the invention, the inlet opening of the guide channel can be formed by parts of the end wall and the side walls which protrude over the profile or cross-section of the channel section which extends along the headbox. The available space thus can be optimally used and there will be also achieved the result that the end wall extends in a manner which is particularly favorable for a low-loss deflection or turning of the partial stock flow or stream.

To ensure for a positive and low-loss separation of the partial flow or stream to be withdrawn from the primary or main flow of the fiber stock suspension, it is advantageous if the side wall of the guide channel, which faces the flow path of the main flow or stream of the fiber stock suspension, at the region of the inlet opening contains a sharp separating or partition edge which is directed opposite to the flow direction of the free stock jet and is capable of subdividing the stock flow, and a break-away or tear-off edge for the main flow of the fiber stock suspension which is disposed adjacent to the separating edge with respect to the flow direction.

According to a design which is particularly favorable with respect to flow and structurally simple, the break-away edge can be formed at an outer surface of the side wall which extends essentially parallel to the flow direction of the free jet, this break-away edge being formed in conjunction with the inner surface of such side wall.

BRIEF DESCRIPTION OF THE DRAWINGS

The invention will be better understood and objects other than those set forth above, will become apparent when consideration is given to the following detailed description thereof. Such description makes reference to the annexed drawings wherein:

FIG. 1 is a schematic and partial illustration of a papermaking machine constructed according to the invention and containing a deflecting device or means constructed and arranged according to the teachings of the invention;

FIG. 2 is a partial top plan view on an enlarged scale of a detail of the papermaking machine shown in FIG. 1, partially in section as taken substantially along the line II—II of FIG. 1;

FIG. 3 is a partial sectional view, corresponding to the section line III—III of FIG. 2, and shown in a still more enlarged scale, depicting details of the deflecting device or means shown in FIG. 2; and FIG. 4 is a schematic partial illustration of a further embodiment of papermaking machine provided with a deflecting device constructed according to the invention.

DETAILED DESCRIPTION OF THE PREFERRED EMBODIMENTS

Describing now the drawings, it is to be understood that only enough of the construction of the papermaking machine has been shown as needed for those skilled in the art to readily understand the underlying principles and concepts of the present development, while simplifying the showing of the drawings. Turning attention now specifically to FIG. 1, there has been schematically illustrated there a first exemplary embodiment of a papermaking machine containing an endless first dewatering wire or sieve 1 which is guided over a water pervious jacket or outer surface of a rotatable dewatering roller or cylinder 2, a deflection roller or roll 3 following the dewatering roller or cylinder 2, and a guiding or guide roller 4 which may be designed in known way as a tensioning roller. The first wire or sieve 1 coacts with a second wire or sieve 5 which is guided at guiding or guide rollers 6, one of which also may be designed as a tensioning roller, as well as at a displaceable guiding roller or roll 7. The second wire or sieve 5 is convergently guided and brought together with the first wire or sieve 1 and delimits, in conjunction therewith, a substantially wedge-shaped infeed throat or gap 8. At a subsequent dewatering region or zone M the second wire or sieve 5 is passed over the dewatering roller or cylinder 2 together with the first wire or sieve 1. The position of the run-on or inbound location of the second wire or sieve 5 at the first wire or sieve 1, which revolves in the direction of the arrow 9 during operation of the papermaking machine, is determined by the position of the adjustable guiding or guide roller 7. This guiding or guide roller 7 is appropriately displaceably guided in the direction of the double-headed arrow 10 for adjustment of the infeed throat or gap 8 in a manner which is known as such and therefore not here particularly illustrated.

Below the first wire or sieve 1 there is arranged an endless third wire or sieve 12 which revolves in the direction of the arrow 11 and which has only been partially illustrated in the drawing. This third wire or sieve 12 is convergently guided and brought together at the region of the deflection roller 3 with a section or portion of the first wire or sieve 1 extending over the deflection roller 3. A second substantially wedge-shaped infeed throat or gap 13 is thus formed. Thereafter, the third wire or sieve 12 is guided along the section of the first wire or sieve 1 which extends between the deflection roller 3 and the guide roller 4 and to other operational or working sections of the papermaking machine by here not further shown but conventional guide elements.

Operatively associated with the first wire or sieve 1 and the third wire or sieve 12 are respective stock infeed devices, namely headboxes 15 and 16 for infeeding a respective fiber stock suspension which is to be fed to the infeed throat or gap 8 and the third wire or sieve 12, respectively, in order to form a fiber web or ply. The headboxes 15 and 16 are each conventionally connected to a supply conduit or duct 20 of a not particularly illustrated but conventional fiber stock suspension supply system as well as to a return conduit or duct 21 by means of which a residual flow of the fiber stock suspension, which is generally supplied in excess, is recycled in known manner back to the associated fiber stock suspension supply system.

The fiber stock supply system for the headbox 15 is shown in FIG. 2. The headbox 16 can be connected to a corresponding fiber stock supply system. The amount of stock suspension to be supplied to the infeed throat or gap 8 and to the third wire or sieve 12, respectively, each efflux from the first and second headboxes 15 and 16 in the form of a free stock jet which is directed towards the first wire or sieve 1 and towards the third wire or sieve 12, respectively. Each free stock jet extends across the entire operating width A of the first and second headboxes 15 and 16.

Two stock deflecting devices or means 51 are provided between the first headbox 15 and the section 1a of the first wire or sieve 1 which runs towards the first infeed throat or gap 8. These deflecting means or deflectors 51 can be inserted from both sides into the flow path of the free jet and they are displaceable substantially parallel to the extension of the width of the first headbox 15. Such deflecting means 51 each serve to separate and carry-off or withdraw a respective partial stock flow or stream to be taken-up at a respective one of the two marginal zones or regions C of the operating or working width A from the quantity of fiber stock suspension eggressing from the first headbox 15. The deflecting devices 51 may be connected to the supply conduit 20 of the stock suspension supply system via any suitable return means or devices for example return lines which are not here particularly illustrated and which do not constitute subject matter of the present invention.

Two further deflecting devices or means 51 can be arranged between the second headbox 16 and the third wire or sieve 12, which also may be connected via not illustrated return conduits or pipes or equivalent return means to the stock suspension supply system associated with the second headbox 16.

However, according to modified versions of the papermaking machine as described hereinbefore, the deflecting devices 51 operatively associated either with the first headbox 15 or with the second headbox 16 can be omitted.

The direction of flow of the free stock jet leaving the first headbox 15 is indicated by arrows 23 in FIG. 2. The deflecting devices 51 each contain a guide channel 52 of essentially rectangular cross-section which essentially extends in the running or travel direction of the first wire or sieve 1, as generally indicated by the arrow 9. Since the deflecting devices 51 associated with the other headbox 16 are constructed similar to the deflecting devices associated with the headbox 15, it will suffice to describe in detail the construction of the deflection devices 51 associated with the headbox 15. Each guide channel 52 has one end which is disposed downstream and another end which is disposed upstream with respect to the running or travel direction of the first wire or sieve 1 indicated by the arrow 9. At the downstream end each guide channel 52 comprises an inlet section or portion 53 which can be introduced between the converging first sieve or wire 1 and the second sieve or wire 5. In the case of the deflecting devices 51 of the other or second headbox 16 each guide channel 52 thereof contains a corresponding inlet section or portion 53 which can be introduced between the headbox 16 and the related wire 12 travelling in the direction of the arrow 11. At the upstream end each guide channel 52 comprises an outlet section or portion 54 which opens into a bent section or elbow 55. The bent section or elbow 55 contains a withdrawal or discharge member 28 of substantially circular cross-section which extends transversely with respect to the travel direction (arrow 9) of the first wire or sieve 1, or in the case of the headbox 16 transversely with respect to the travel direction, indicated by the arrow 11, of the third wire or sieve 12. The withdrawal or discharge members 28 are led away from the marginal or edge regions C of the operating or working width A of the related first headbox 15 or second headbox 16, as the case may be, and are connected to the aforementioned return conduits or lines.

In the following description the detailed discussion of the construction and function of the deflecting devices or means 51 will be undertaken with reference to the deflecting devices 51 associated with the first headbox 15. As already mentioned, the further deflecting devices 51 associated with the second headbox 16 are analogously constructed and function in a corresponding manner, so that a detailed description thereof appears unwarranted.

As will be evident from FIGS. 2 and 3, the guide channels 52 each comprise two side walls 56 and 57, an outer guiding or guide wall 58 extending along the neighboring section 1a of the first wire or sieve 1 and an inner guiding or guide wall 60 extending along the neighboring first headbox 15 as well as an end wall 61 surrounding the inlet section or portion 53. The end wall 61 contains a rectilinear wall portion or section 62 and a rectilinear wall portion or section 62a. The wall portion or section 62 and the wall portion or section 62a are inclined or angled towards each other; they extend in a spaced relationship from the inner guiding or guide wall 60 and protrude above the same in a roof-like manner. The end wall 61 further comprises a wall member 63 which is contiguous to the wall portion or section 62 and which possesses a concave shape towards the flow path of the partial flow or stream to be withdrawn. The wall member 63 changes over into the outer guide wall 58. The rectilinear or straight wall section 62 is arranged to form an acute angle $\gamma$ with the outer guide wall 58. Together with the adjacent end of the inner guiding or guide wall 60 and with two parts of the side walls 56 and 57 which protrude past the inner guide wall 60, the rectilinear wall section 62 delimits or bounds an inlet opening 30 which is directed in opposition to the flow direction of the free jet as indicated by the arrows 23. The extension of the width of the inlet opening 30 determines the maximum width of the partial stock flow or stream to be taken-up at the related marginal region C from the fiber stock suspension outflowing from the first headbox 15. The two marginal regions or zones C delimit the main or primary flow of the fiber stock suspension which effluxes across the width B in the form of a free jet from the first headbox 15.

The inclination angle $\gamma$ between the wall section 62 of the end wall 61 and the outer guide or guiding wall 58 may be greater by an angle $\delta$ in the range of 10° to 30° than the adjustment angle $\epsilon$ adjusted between the outer guide wall 58 and the direction of flow of the free jet as indicated by the arrows 23; the adjustment angle $\epsilon$ is provided for the operation of the papermaking machine and is governed, for example, by the course of travel of the first wire or sieve 1 and the second wire or sieve 5. The range of values 10° to 30° as given for the angle $\delta$ will have to be considered as approximate threshold or limiting values. To ensure for a positive engagement of the partial stock flow or stream under optimum flow conditions, the angle $\delta$ generally will be in the order of about 25°. Thus, there will be obtained a low-loss and detachment-free deflection of the flow impinging upon the end wall 62.

The side walls 56 facing the flow path of the main or primary stock flow of the width B are each provided with a sharp separating or partition edge 35 which is disposed at the inlet section or portion 53 and which is directed opposite to the flow direction indicated by the arrows 23. This separating edge 35 ensures for as low-loss as possible separation of the partial flow or stream to be taken-up from the main flow of the fiber stock suspension. The separating edge 35 is formed at a part 36 of the outer surface of the side wall 56 which extends parallel to the flow direction of the free jet indicated by the arrows 23 and which confronts the main stock flow. The outer surface of the side wall 56 changes over into a break-away or tear-off edge 37 for the main stock flow and which is provided downstream from the separating edge 35. Due to the break-away edge 37 there is ensured a positive flow separation of the main flow of the fiber stock suspension which is to be introduced into the infeed throat or gap 8 from the side wall 56. There is thus prevented impairment of the formation or orientation of the stock fibers in the related marginal zone of the main stock flow.

The partial flows of the fiber stock suspension to be deflected are engaged and led away at the marginal regions C in accordance with the momentary positions of the deflecting devices or means 51. The deflecting devices 51 are each arranged to be displaceable in the direction of the double-headed arrow 40 and so as to be fixed in position such that the widths of the marginal zones or regions C can be continuously or infinitely varied within the limits governed by the width dimensions of the inlet openings 30. Generally, both deflection devices 51 preferably will be used for removing marginal zones or regions C of equal width in order to reduce the operating or working width of the free stock jet directed towards the infeed throat or gap 8 in the case of the headbox 15, and in comparable fashion the operating width of the free stock jet directed towards the third wire or sieve 12 in the case of the other or second headbox 16. However, it is also conceivable that only one unilaterally arranged deflecting device or means 51 is used to remove only a single partial flow or stream.

The fiber stock suspension supplied by the first headbox 15 will be dewatered as it passes through the dewatering zone or region M. The fiber web or ply thus formed and adhering to the first wire or sieve 1 is then brought into the second infeed throat or gap 13 together with a second fiber web or ply formed by the second headbox 16. The two-layered fiber web thus formed is then delivered in known manner to not further illustrated operational or working regions of the papermaking machine.

A second embodiment of papermaking machine according to the invention is shown in schematic view in FIG. 4. According to the illustration of FIG. 4, the deflecting device or means 51 are arranged above the first headbox 15, roughly at the region between the first headbox 15 and the second wire or sieve 5. In such arrangement, the partial flow or stream of the fiber stock suspension to be taken-up or engaged is upwardly deflected at the end wall 61, conducted so-to-speak "overhead" into the related guide channel 52 and guided therethrough towards the withdrawal or discharge member 28. In this design the inner guide or guiding wall 60 forms the bottom or base of the guide channel 52.

Generally, the fiber stock suspensions inputted by the first and second headboxes 15 and 16 have different raw material qualities. Thus, a layer of a lower grade material like, for example, the base or carrier layer of a cardboard, may be formed by the second headbox 16, while a layer of higher grade material like, for example, a white cover or top layer for the cardboard may be formed by the first headbox 15. Due to the deflecting devices or means 51 constructed and arranged in the papermaking machine according to the invention, the amounts of fiber stock suspension which are in excess for the momentarily fabricated product or format, and which have different stock qualities, can be separately engaged and recycled for re-use.

Separate take-up or engagement of the different stock qualities is also possible according to a modified design of the papermaking machine in which, for example, the deflecting devices or means 51 associated with the second headbox 16 are omitted. Correspondingly, the second headbox 16 is operated with a non-reduced operating or working width A, so that the margins or edges of the fiber web or ply formed from the stock suspension supplied by the second headbox 16 protrude past the fiber web or ply formed by the first headbox 15 either above or below this fiber web or ply. The protruding margins or regions may be removed from the third wire or sieve 12 downstream of the second infeed gap or throat 13 by, for instance, spraying or washing the same; again the removed fiber stock can be recycled or returned, for example, to the fiber stock supply system preceding the second headbox 16.

As already mentioned, also only the second headbox 16 may be operated at a reduced operating or working width A, in which case then the deflecting devices or means 51 associated with the first headbox 15 can be omitted. In the same manner, also further headboxes which are not illustrated in FIG. 1 like, for example, one or a number of additional headboxes 16 directed towards the third wire or sieve 12, may also each be provided with corresponding deflecting devices or means 51. In such a design of the papermaking machine having a number of further headboxes 16 and disposed in an arrangement which corresponds to that of a longitudinal wire papermaking machine, the first wire or sieve 1 and the second wire or sieve 5 may be dispensed with together with the first headbox 15.

In place of the aforementioned wires or sieves 1, 5 and 12 different water pervious dewatering bands like, for example, bands made of felt or the like, also can be used. Baffles may be provided in the bent sections or elbows 55 in order to guide the quantity of fiber stock suspension to be removed. Correspondingly, the guide channels 52 also may contain concave-shaped wall sections or portions instead of the continuously curved wall members 63. Such concave-shaped wall sections could be composed of planar wall sections which are inclined towards each other, each pair of such wall sections enclosing an angle of 155°, for example.

Furthermore, the guide channels 52 also may be of a substantially trough-like design. In corresponding manner the respective inner guiding or guide wall 60 may be omitted, if desired, in the arrangement shown in FIGS. 1 and 2. In the arrangement shown in FIG. 4, the outer guide or guiding wall 58 may be omitted in a channel section which extends approximately over the length of the guiding wall 60.

While there are shown and described present preferred embodiments of the invention, it is to be distinctly understood that the invention is not limited thereto, but may be otherwise variously embodied and practiced within the scope of the following claims.

Accordingly, what we claim is:

1. A papermaking machine comprising:
    at least one dewatering means for forming a fiber web and movable in a predetermined direction of travel;
    at least one headbox for infeeding fiber stock suspension to be applied to said at least one dewatering means along a flow path for the fiber stock suspension and impinging upon said at least one dewatering means at a predetermined impact location;
    said at least one headbox possessing a predetermined operating width containing at least one marginal region and an outfeed slice extending across said operating width;
    said at least one headbox being spaced from said dewatering means to permit said fiber stock suspension to be discharged from said outfeed slice in the form of a free stock jet having a predetermined flow direction;
    at least one deflecting means operatively associated with said at least one marginal region of said at least one headbox and insertable into said predetermined flow path of said fiber stock suspension between said predetermined impact location and said outfeed slice in order to separate a partial flow of the fiber stock suspension which is to be engaged at said at least one marginal region from a main flow of said fiber stock suspension;
    said at least one deflecting means containing a guide channel arranged adjacent said at least one headbox and extending transversely with respect to said predetermined flow direction of said free stock jet;
    said dewatering means including a dewatering section located adjacent said guide channel and movable in said predetermined direction of travel;
    said guide channel being substantially directed in said direction of travel of said dewatering section of said dewatering means located adjacent to said guide channel;
    said guide channel comprising:
        two side walls;
        at least one guiding wall interconnecting said two side walls;
        an end wall arranged at an end of said guide channel which is located downstream of said predetermined direction of travel of said dewatering means and which extends transversely with respect to said predetermined flow direction of said free stock jet;
    said end wall together with said two side walls delimiting an inlet opening; and
    said end wall containing a wall member which is substantially concavely configured towards said partial flow and serving to deflect said partial flow of said fiber stock suspension towards said at least one guiding wall;
    a discharge member located upstream of said inlet opening with respect to said predetermined direction of travel of said dewatering means and extending outwardly of the region of said operating width of said at least one headbox; and
    said guide channel being operatively connected in flow communication with said discharge member.

2. The papermaking machine as defined in claim 1, wherein:
    said at least one guiding wall extends substantially along said at least one headbox.

3. The papermaking machine as defined in claim 1, wherein:
    said inlet opening delimited by said end wall and said two side walls is directed opposite to said predetermined flow direction of said free stock jet.

4. The papermaking machine as defined in claim 1, wherein:
    said end wall of said guide channel contains a wall section serving as an impact location for said free stock jet;
    said at least one guiding wall constituting an outer guiding wall;
    said wall section enclosing a predetermined angle with said outer guiding wall;
    said headbox and said deflecting means being positionable relative to one another to form an adjustment angle adjustable for the operation of the papermaking machine and formed by said at least one guiding wall and said predetermined flow direction of said free stock jet; and
    said predetermined angle being greater by an angle in a range of about 10° to 30° than said adjustment angle as adjusted for operation of the papermaking machine.

5. The papermaking machine as defined in claim 1, wherein:
    said end wall of said guide channel contains a wall portion protruding in a substantially roof-like manner past said inlet opening.

6. The papermaking machine as defined in claim 1, wherein:
    a channel section of said guide channel has a predetermined profile and extends along said at least one headbox;
    parts of said end wall and of said two side walls protruding over said predetermined profile; and
    said inlet opening of said guide channel being formed by said protruding parts.

7. The papermaking machine as defined in claim 1, further including:
    a substantially sharp separating edge for subdividing the flow of fiber stock suspension into said partial flow and said main flow;
    said sharp separating edge being located at the region of said inlet opening and provided at one of said two side walls of said guide channel which faces the flow path of said main flow of fiber stock suspension and being directed opposite to said predetermined flow direction of said free stock jet;

a break-away edge for said main flow; and said break-away edge being located adjacent to said separating edge with respect to said predetermined flow direction of the free stock jet.

8. The papermaking machine as defined in claim 7, wherein:

said one of said two side walls possesses an outer surface extending substantially parallel to said predetermined flow direction of said free stock jet and an inner surface; and said break-away edge being formed by said outer surface in conjunction with said inner surface.

9. The papermaking machine as defined in claim 8, wherein:

said sharp separating edge being located at the inner surface of said one side wall.

10. The papermaking machine as defined in claim 1, wherein:

said at least one dewatering means comprises a dewatering wire.

* * * * *